(12) United States Patent
Kim et al.

(10) Patent No.: US 10,264,707 B2
(45) Date of Patent: Apr. 16, 2019

(54) FLAT PLATE PULSATING HEAT PIPE APPLICABLE AT VARIOUS ANGLES AND METHOD OF MANUFACTURING SAME

(71) Applicant: KOREA ADVANCED INSTITUTE OF SCIENCE AND TECHNOLOGY, Daejeon (KR)

(72) Inventors: Sung Jin Kim, Daejeon (KR); Gi Hwan Kwon, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 95 days.

(21) Appl. No.: 15/518,814

(22) PCT Filed: May 22, 2015

(86) PCT No.: PCT/KR2015/005209
§ 371 (c)(1),
(2) Date: Apr. 13, 2017

(87) PCT Pub. No.: WO2016/060350
PCT Pub. Date: Apr. 21, 2016

(65) Prior Publication Data
US 2017/0245393 A1    Aug. 24, 2017

(30) Foreign Application Priority Data

Oct. 14, 2014  (KR) .................. 10-2014-0138168
Jan. 20, 2015  (KR) .................. 10-2015-0009528

(51) Int. Cl.
*H05K 7/20*    (2006.01)
*F28D 15/02*   (2006.01)
(Continued)

(52) U.S. Cl.
CPC ..... *H05K 7/20336* (2013.01); *F28D 15/0266* (2013.01); *F28D 15/043* (2013.01);
(Continued)

(58) Field of Classification Search
CPC ........... H05K 7/20336; H05K 7/20309; H05K 7/20318; F28D 15/0266; F28D 15/043;
(Continued)

(56) References Cited

U.S. PATENT DOCUMENTS

2002/0007937 A1   1/2002  Kroliczek et al.
2003/0037910 A1*  2/2003  Smyrnov ............ F28D 15/0266
                                                    165/104.26
(Continued)

FOREIGN PATENT DOCUMENTS

JP    2002-081874 A    3/2002
KR    20-0364898 Y1    10/2004
(Continued)

OTHER PUBLICATIONS

Arab et al., "Experimental investigation of extra-long pulsating heat pipe application in solar water heaters", Experimental Thermal and Fluid Science, vol. 42, 2012, pp. 6-15.
(Continued)

*Primary Examiner* — Justin M Jonaitis
(74) *Attorney, Agent, or Firm* — Birch, Stewart, Kolasch & Birch, LLP

(57) ABSTRACT

Disclosed is a flat plate pulsating heat pipe (FP-PHP) serving as a power-free high efficiency heat transfer system for small electronic devices such as mobile phones and laptop computers. The FP-PHP is manufactured using MEMS technology and configured to have a single-turn loop or a multi-turn loop, each having a single diameter channel or a dual diameter channel. Further, since a working fluid used in a flat plate pulsating heat pipe exhibits different
(Continued)

characteristics according to the main working temperature, provided is a flat plate pulsating heat pipe which includes a working fluid having optimum efficiency in the main working temperature. In addition, the flat plate pulsating heat pipe applicable at various installation angles, of the present invention which is for achieving the above purpose, includes: a silicon lower wafer plate having a rectangular shape; a capillary tube comprising a channel which has a constant depth on the upper surface of the silicon wafer lower plate and is formed in the form of a straight line along the longitudinal direction of the silicon wafer lower plate, wherein the channel forms a closed loop which is bent at both ends of the silicon wafer lower plate and is connected; a wafer upper plate which is coupled on top of the silicon wafer lower plate and seals the capillary tube; and a working fluid filled inside the capillary tube, wherein the capillary tube is made of a combination of a dual-diameter tube including a pair of channels having different widths and a single diameter tube including a pair of channels having the same width.

19 Claims, 14 Drawing Sheets

(51) Int. Cl.
    *F28D 15/04* (2006.01)
    *F28F 13/10* (2006.01)
    *H01L 23/427* (2006.01)
(52) U.S. Cl.
    CPC ......... *F28F 13/10* (2013.01); *H05K 7/20309* (2013.01); *H05K 7/20318* (2013.01); *F28D 2015/0225* (2013.01); *H01L 23/427* (2013.01)
(58) Field of Classification Search
    CPC . F28D 2015/0225; F28F 13/10; H01L 23/427
    USPC ....................................... 165/104.26, 104.21
    See application file for complete search history.

(56) References Cited

U.S. PATENT DOCUMENTS

| | | | | |
|---|---|---|---|---|
| 2008/0087406 | A1* | 4/2008 | Asfia | F28D 15/0233 165/104.29 |
| 2009/0101308 | A1* | 4/2009 | Hardesty | F28D 1/035 165/80.4 |
| 2009/0323276 | A1* | 12/2009 | Mongia | G06F 1/203 361/679.52 |
| 2011/0067843 | A1* | 3/2011 | Vasiliev, Jr. | F28D 15/0233 165/104.26 |
| 2011/0079022 | A1 | 4/2011 | Ma et al. | |
| 2011/0206077 | A1 | 8/2011 | Schlie et al. | |
| 2013/0044776 | A1 | 2/2013 | Schlie et al. | |
| 2013/0112375 | A1 | 5/2013 | Choi et al. | |
| 2013/0133871 | A1* | 5/2013 | Ma | F28D 15/0266 165/185 |
| 2015/0072424 | A1 | 3/2015 | Ma et al. | |

FOREIGN PATENT DOCUMENTS

| | | | | |
|---|---|---|---|---|
| KR | 10-2005-0115504 | A | 12/2005 | |
| KR | 10-2010-0108978 | A | 10/2010 | |
| KR | 10-2011-0090491 | A | 8/2011 | |
| KR | 10-2011-0128539 | A | 11/2011 | |
| KR | 20110128539 | A * | 11/2011 | ......... F28D 15/0233 |
| KR | 10-2012-0042403 | A | 5/2012 | |
| KR | 10-2012-0117411 | A | 10/2012 | |
| KR | 10-1250326 | B1 | 4/2013 | |
| TW | 201116793 | A * | 5/2011 | |

OTHER PUBLICATIONS

Charoensawan et al., "Closed loop pulsating heat pipes Part A: parametric experimental investigations", Applied Thermal Engineering, vol. 23, 2003, pp. 2009-2020
International Search Report (PCT/ISA/210) issued in PCT/KR2015/005209, dated Jul. 27, 2015.
Khandekar et al., "An insight into thermo-hydrodynamic coupling in closed loop pulsating heat pipes", International Journal of Thermal Sciences, vol. 43, 2004, pp. 13-20.
Kwon et al., "Analysis of Pulsating Heat Pipe With a Dual-Diameter Tube", HEFAT2014, 10th International Conference on Heat Transfer, Fluid Mechanics and Thermodynamics, Jul. 14-26, 2014, Orlando, Florida, 8 pages.
Kwon et al., "Operational characteristics of pulsating heat pipes with a dual-diameter tube", International Journal of Heat and Mass Transfer, vol. 75, 2014, pp. 184-195.
Kwon et al., "Study on the Flow and Heat Transfer Characteristics of Pulsating Heat Pipe With Asymmetric Configuration", Proceedings of the ASME 2013 International Technical Conference and Exhibition on Packaging and Integration of Electronic and Photonic Microsystems, InterPACK2013, Jul. 16-18, 2013, Burlingame, CA, US, pp. 1-6.
Kwon et al., "Study on thermal performance of pulsating heat pipe with asymmetric configuration", The Society of Air-Conditioning and Refrigerating Engineers of Korea, 2013 Summer Annual Conference, 2013, pp. 968-971.
Kwon et al., "Study on Thermal Performance of Pulsating Heat Pipes with a Dual-Diameter Tube", The Korean Society of Mechanical Engineers, Thermal Engineering Part, 2014 Summer Annual Conference, 2014, pp. 244-245.
Kwon, Gi Hwan, "Study on the Thermal Performance of Pulsating Heat Pipe with Dual-diameter Channels", School of Mechanical Engineering & Aerospace System Division of Mechanical Engineering, KAIST, 2014, 126 pages.

* cited by examiner

Plan view  Side view

FLAT PLATE PULSATING HEAT PIPE APPLICABLE AT VARIOUS ANGLES AND METHOD OF MANUFACTURING SAME

TECHNICAL FIELD

The present invention relates to a compact flat plate pulsating heat pipe capable of controlling temperature without using external power in ultra-thin mobile devices with maximized portability, such as smart phones, table PCs, etc.

BACKGROUND ART

With performance improvement of microprocessors, electronic devices are becoming smaller and lighter. Recently, the demand for ultra-thin mobile devices with maximized portability, such as smart phones and table PCs, is rapidly increasing. These electronic devices typically have a stacked structure with very limited room for a cooling system. For this reason, the need for an effective cooling system has arisen.

A heat pipe is a micro cooling system and is a representative power-free thermal control device. Conventional heat pipes consist of a vacuumed and sealed tube containing a predetermined amount of working fluid. The inner wall of the sealed tube is composed of a capillary structure having working fluid passages for moving a working fluid by capillary action. A heat generating means or a heating means is installed outside the sealed tube to be arranged near an end portion of the sealed tube, so that the end portion of the sealed tube functions as an evaporator (heating unit) that evaporates the working fluid. Meanwhile, a heat-dissipating means or a cooling means is installed outside the sealed tube to be arranged near a opposite end portion of the sealed tube, so that the opposite end portion of the sealed tube functions as a condenser (cooling unit) that condenses the working fluid.

This heat pipe transfers heat from a heat generating means and a heat-dissipating means to a heating means and a cooling means and vice versa with the use of latent heat, which is concomitant with frequent liquid-vapor phase changes caused by an evaporator and a condenser. Therefore, this heat pipe exhibits higher heat transfer performance (thermal conductivity) than a case of using a general pure metal. Accordingly, a heat pipe is widely used as a key component for heat transfer in various products including heat exchangers, cooling devices, and heat transfer devices.

However, a conventional heat pipe has a wick (capillary structure) that is typically made of a porous material, such as a metal net, sintered metal powder, or metal fiber, and which has a predetermined thickness or thicker, for circulation of a working fluid. Generally, the thinner the heat pipe, the poorer the performance of the heat pipe. Therefore, there is a limit in application of a conventional heat pipe to ultra-thin electronic devices.

In order to address problems associated with heat pipes employing a wick, recently, a pulsating heat pipe (PHP) using a thin tube with a small diameter as a closed tube has been developed. The pulsating heat pipe evaporates, transfers, condenses, and returns a working fluid through capillary action without using a wick.

However, as to conventional pulsating heat pipes, study and research have been mostly focused on the shape of a single-turn PHP and only liquid such as water has been used as a working fluid. Therefore, there still remains a problem that it is difficult to obtain satisfactory heat transfer performance required for a cooling device for use in electronic devices.

Therefore, there is an urgent need for development of an improved flat plate pulsating heat pipe that has high heat transfer efficiency and which can stably operate in ultra-thin electronic devices.

As a reference, conventional flat plate pulsating heat pipes are disclosed in the following patent documents.

DOCUMENTS OF RELATED ART (Patent Document 1) Korean Patent Application Publication No. 10-2012-0042403

(Patent Document 2) Korean Patent No. 10-1250326

DISCLOSURE

Technical Problem

Accordingly, the present invention has been made keeping in mind the above problems occurring in the prior art, and an object of the present invention is to manufacture a flat plate pulsating heat pipe using Micro Electro Mechanical Systems (MEMS) technology and to provide a power-free high efficiency heat transfer system for use in small electronic devices such as mobile phones and laptop computers.

Another object of the invention is to provide a flat plate pulsating heat pipe having an optimum shape and size by evaluating thermal performance of a flat plate pulsating heat pipe having a single-turn loop or a multi-turn loop and a flat plate pulsating heat pipe having a single diameter channel or a dual diameter channel.

A further object of the present invention is to provide a flat plate pulsating heat pipe having optimum efficiency at a main operation temperature by evaluating characteristics in accordance with temperature ranges of a working fluid used in a flat plate pulsating heat pipe.

Technical Solution

In order to accomplish the above object, the present invention provides a flat plate pulsating heat pipe including: a silicon lower wafer plate having a rectangular shape; an upper wafer plate bonded onto the silicon lower wafer plate; a capillary tube engraved in the silicon lower wafer plate and having a meandering closed loop shape; a working fluid in the capillary tube; and two through-holes provided to respective side surfaces of the silicon lower wafer to communicate with the capillary tube such that the working fluid is charged into and discharged from the capillary tube through the two through-holes.

The capillary tube may have a single-turn loop shape or a multi-turn loop shape, wherein in each case, the capillary tube may have a single diameter channel in which a portion of a channel from a condenser to an evaporator and a portion of the channel from the evaporator to the condenser have an equal diameter or a dual diameter channel in which a portion of a channel from the condenser to the evaporator and a portion of the channel from the evaporator to the condenser have different diameters.

Performance of the flat plate pulsating heat pipe varies according to a diameter difference between the two diameters of the dual diameter channel. When the diameter difference is small, the effect of the diameter difference is negligible, and thus thermal performance improvement cannot be accomplished with a small diameter difference. When the diameter difference is excessively large, forces are overly unbalanced and friction pressure loss abruptly increases in the channel having a smaller diameter, thereby negatively affecting the performance of the flat plate pulsating heat pipe. Therefore, the present invention features that the diameter difference is set such that the flat plate pulsating heat pipe can exhibit an optimum heat transfer performance.

The capillary tube may have a multi-turn loop shape including a single diameter channel in which a portion of a channel from a condenser to an evaporator and a portion of the channel from the evaporator to the condenser have an equal diameter, or including a dual diameter channel in which a portion of a channel from the condenser to the evaporator and a portion of the channel from the evaporator to the condenser have different diameters.

The capillary tube may be a combination of the single diameter channel and the dual diameter channel.

Since the working fluid exhibits thermal characteristics that vary according to operating temperatures of the evaporator, FC-72 is used as the working fluid when a main operating temperature of the evaporator is 100° C. or lower, and ethanol is used as the working fluid when the main operating temperature is higher than 100° C.

A performance index, i.e. figure of merit, that represents the performance of a flat plate pulsating heat pipe is developed to properly analyze and evaluate the thermal characteristics of a flat plate pulsating heat pipe. Using the performance index, a flat plate pulsating heat pipe with an optimum heat transfer performance is provided.

Advantageous Effects

Since a flat plate pulsating heat pipe according to the present invention is manufactured using MEMS technology, the flat plate pulsating heat pipe can be used as an effective cooling system in ultra-thin microelectronic devices as well as in small electronic devices such as mobile phones and laptop computers. Therefore, the flat plate pulsating heat pipe also can be applied to smaller and lighter future electronic devices.

Since the flat plate pulsating heat pipe effectively transfers heat without using external electric power, it is unnecessary to take into account issues such as the storage capacity of an internal power source and connection to an external power source that must be taken into account when applying the flat plate pulsating heat pipe to electronic devices. Therefore, the flat plate pulsating heat pipe allows high flexibility in designing of electronic devices.

Particularly, since the flat plate pulsating heat pipe is a cooling system having a simple structure and independently operating without being connected to an external power source, the flat plate pulsating heat pipe does not require maintenance once installed.

BEST MODE

Mode for Invention

Hereinafter, a flat plate pulsating heat pipe according to an exemplary embodiment of the present invention will be described in detail with reference to the accompanying drawings.

A heat pipe is a representative thermal control device that does not require supply of external electric power. However, a conventional heat pipe includes a wick structure having a predetermined thickness installed therein. The wick structure is provided for the purpose of circulation of a working fluid. Generally, as the thickness of a heat pipe decreases, the performance tends to deteriorate. Accordingly, conventional heat pipes have a limit in application to ultra-thin electronic devices. To overcome this problem, a pulsating heat pipe with no wick structure is suggested.

A pulsating heat pipe takes a form in which one capillary tube is bent in multiple turns, forming a closed loop. The closed loop is evacuated first, and then a working fluid is charged into the closed loop. In this case, a well-aligned slug-train unit consisting of liquid slugs and vapor plugs is formed in the closed loop. At this point, if heat is applied to one side of the closed loop, the aligned slug-train unit performs high-speed self-sustained oscillations and thus heat is transferred from an evaporator to a condenser by this motion.

As described above, a pulsating heat pipe has a simple structure and is equipped with no wick structure. Therefore, a pulsating heat pipe can be manufactured in a small size, and thus it can be suitably applied to microelectronic devices.

Figure 1:
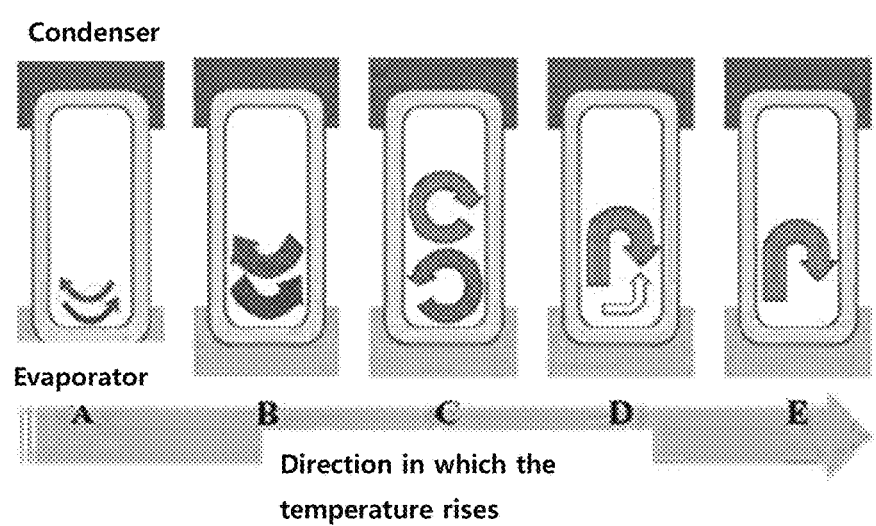
FIG. 1 is a diagram illustrating the operation principle of a conventional pulsating heat pipe.

As illustrated in FIG. 1, the flow in a pulsating heat pipe changes in accordance with heat inputs.

A working fluid forms an oscillating flow (A) that oscillates up and down with small amplitude when the heat input is small. As the heat input increases, the amplitude of the oscillating flow correspondingly increases (B, C). When the heat input further increases, the working fluid does not oscillate but forms a circulation flow which moves in one direction (D, E).

When circulation motion occurs in the heat pipe, the heat pipe exhibits higher thermal performance. Due to the circulation flow, the working fluid cools down to a sufficiently low temperature while passing through a condenser, and then directly enters into an evaporator. Therefore, the circulation flow offers a higher heat transfer effect than the oscillating flow.

Figure 2:
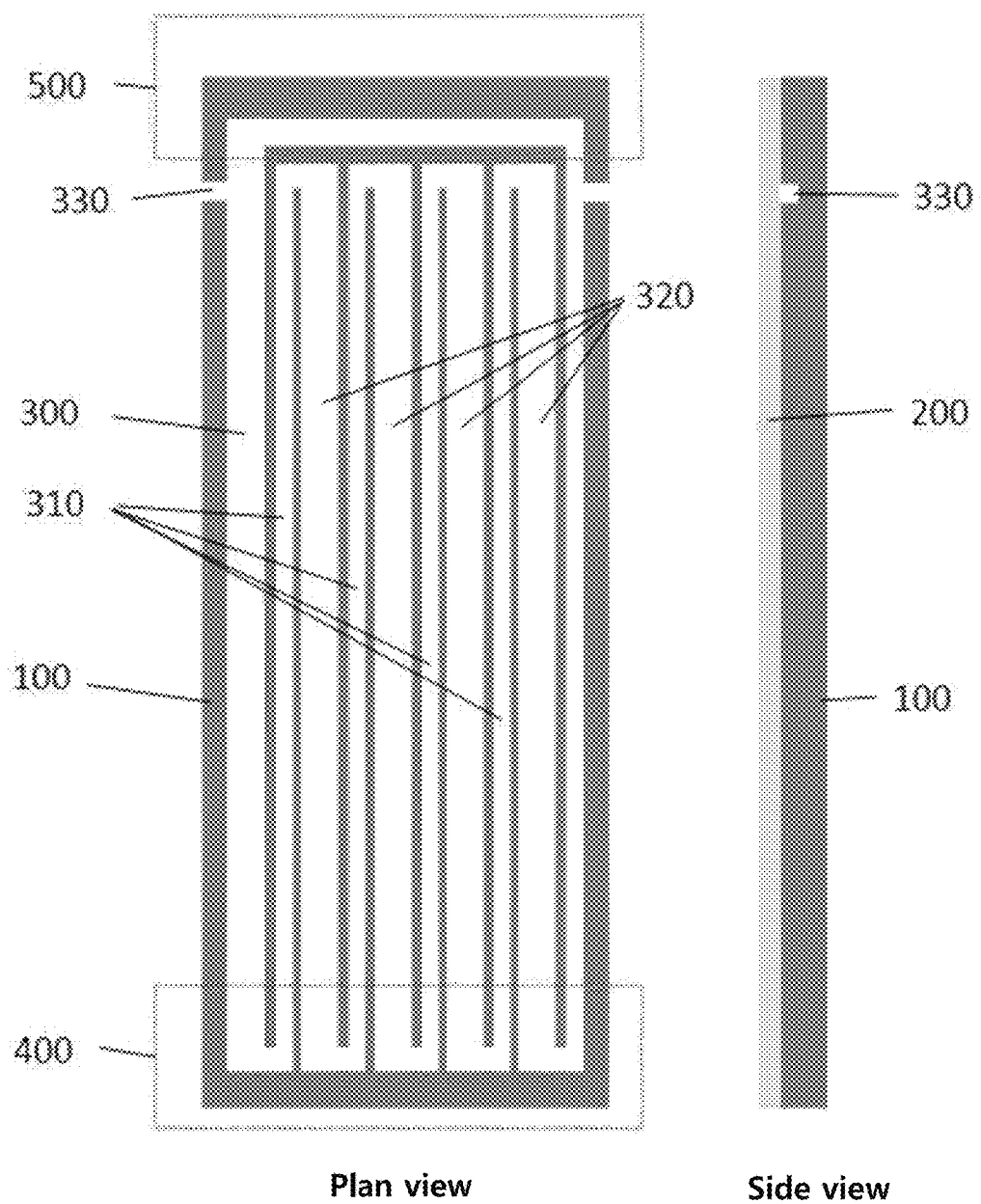
FIG. 2 is a diagram illustrating main components of a flat plate pulsating heat pipe according to an exemplary embodiment of the present invention.

As illustrated in FIG. 2, a flat plate pulsating heat pipe includes: a silicon lower wafer plate 100, an upper wafer plate 200, a capillary tube 300, a working fluid in the capillary tube 300, an evaporator 400 provided in one end portion of the capillary tube in a longitudinal direction of the lower silicon wafer plate 100 and arranged near an external heat source, a condenser 500 that is provided in the opposite end portion of the capillary tube in the longitudinal direction of the lower silicon wafer plate 100 and at which the working fluid heated by the external heat source radiates heat outside the capillary tube, and two through-holes 330 through which a working fluid is charged into and discharged from the flat plate pulsating heat pipe.

The silicon lower wafer plate 100 is a 1 mm silicon wafer that is commonly used to manufacture MEMS. The upper wafer plate may be made of the same material as the silicon lower wafer plate 100, or may be made of glass that allows an inspector to check on the movement and state of a working fluid during testing. A representative example of the glass of the upper wafer plate is PYREX (registered trademark).

Figure 3:
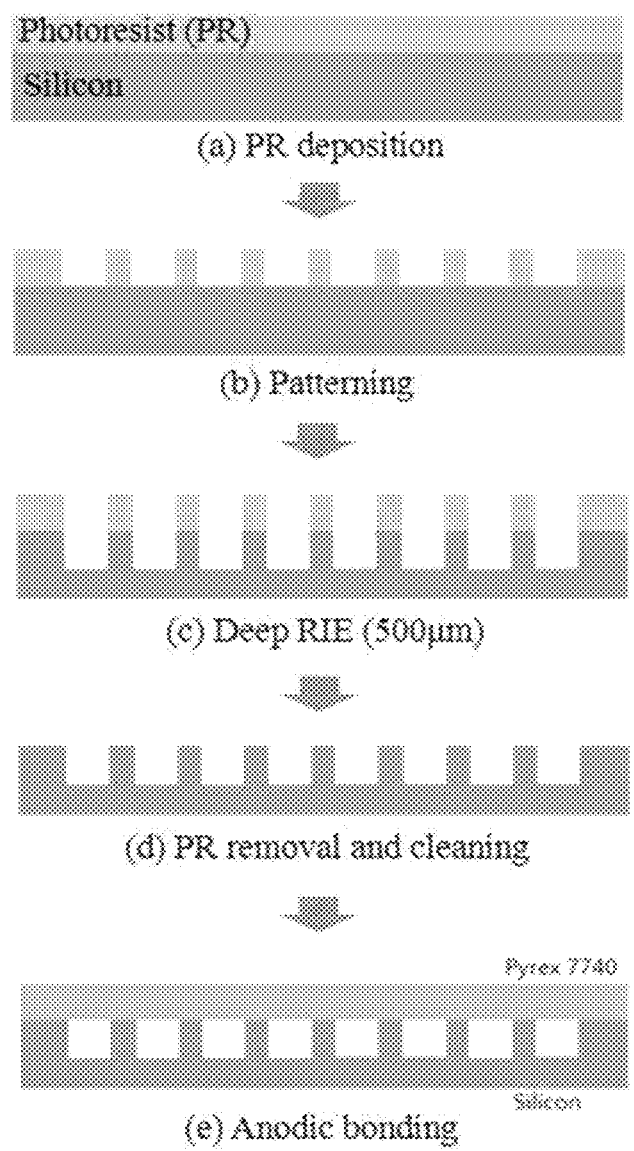
FIG. 3 is a diagram illustrating a method for manufacturing a flat plate pulsating heat pipe according to the exemplary embodiment of the present invention.

A method of manufacturing a flat plate pulsating heat pipe according to the exemplary embodiment of the present invention is illustrated in FIG. 3.

First, a photoresist layer is deposited on an upper surface of a rectangular silicon wafer 100 through a physical deposition process or a chemical deposition process (Step (a)).

The photoresist layer is patterned in the form of a capillary tube 300 having a closed loop shape that is bent at positions near respective ends of the silicon wafer 100. The patterning is performed by various methods, such as lithography, photolithography, electron beam lithography, ion ray lithography, X-ray lithography, and diamond patterning (Step (b)).

Next, dry or wet etching is performed to form the capillary tube 300 and through-holes 330 in an upper portion of the silicon wafer 100. In this process, dry etching and wet etching can be used in combination. In one embodiment of the present invention, deep reactive ion etching (Deep RIE), which is a representative combined wet and dry etching process, was used and an etching depth was 500 mm.

Next, the remaining photoresist layer on the silicon wafer is removed. An upper plate of glass is bonded onto the silicon wafer 100 to produce a flat plate pulsating heat pipe. In the bonding process, anodic bonding may be used because a bonding surface is very flat and smooth due to the nature of glass, whereby it is possible to produce a flat plate pulsating heat pipe with high bonding performance.

Finally, a working fluid is injected into the flat plate pulsating heat pipe through the through-holes 330 formed to pass through respective side end portions of the flat plate pulsating heat pipe, and then the through holes are sealed. In this process, when a working fluid or air is injected through one of the through holes and air is suctioned through the other one by a vacuuming apparatus, charging and discharging of a working fluid into and from the flat plate pulsating heat pipe can be effectively performed. That is, the structure with two through holes has an advantage over the structure with one through hole in that changing and discharging of a working fluid is faster and more precisely controlled.

The thermal characteristics of the flat plate pulsating heat pipe are largely affected by the shape of the capillary tube 300 engraved in the silicon wafer 100.

Figure 4:
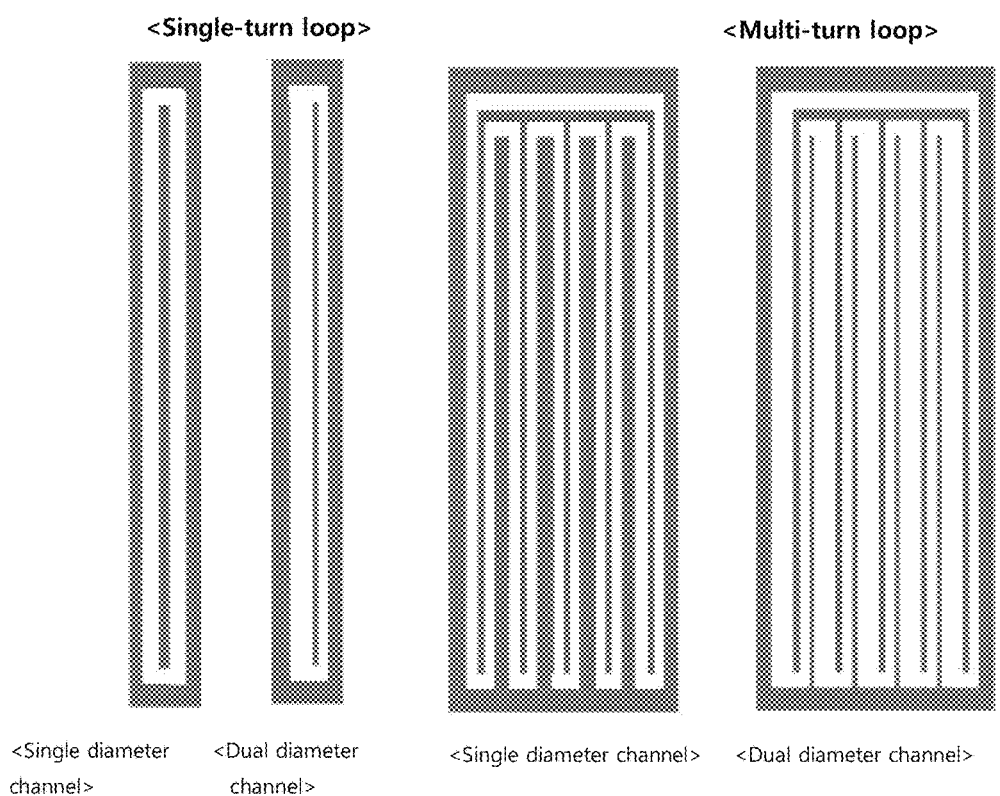
FIG. 4 is a diagram illustrating basic types of flat plate pulsating heat pipes classified according to the shapes of a capillary tube, according to the exemplary embodiment of the present invention.

As illustrated in FIG. 4, the shapes of the capillary tube 300 are classified into a single-turn loop and a multi-turn loop according to the number of turns or into a single diameter channel or a dual diameter channel according to variation in the diameter of the capillary tube.

Typically, a capillary tube engraved through dry etching or combined dry and wet etching tends to be a rectangular shape rather than a circular shape. For analysis on performance of a flat plate pulsating heat pipe, the rectangular capillary tube is considered to be an equivalent circular tube. The diameter $D_h$ of the equivalent circular tube is calculated according to Equation 1.

$$D_h = \frac{4A_c}{\text{Perimeter}} = \frac{2wh_{ch}}{w+h_{ch}} \qquad \text{Equation 1}$$

where $A_C$ is area, perimeter is length of circumference, w is width of capillary tube, and $h_{ch}$ is height of capillary tube.

Figure 5:
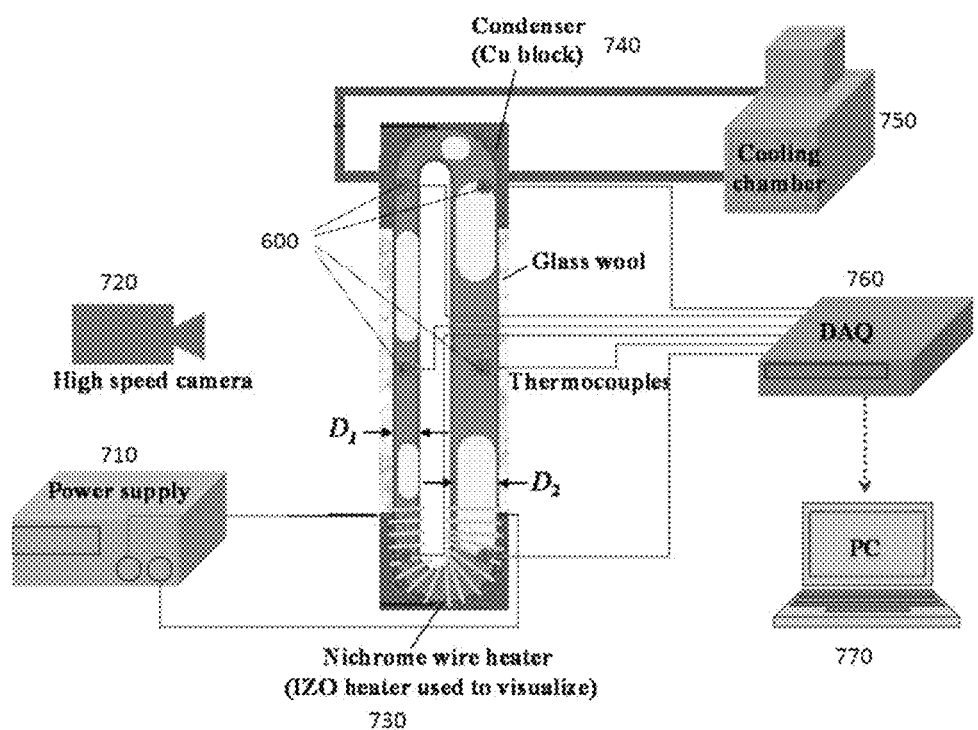
FIG. 5 is a diagram illustrating a test system for evaluating operational characteristics of the flat plate pulsating heat pipe according to the exemplary embodiment of the present invention.

In the present invention, to evaluate operational characteristics of a flat plate pulsating heat pipe, a test system shown in FIG. 5 was prepared. First, a Nichrome-coated hot wire was prepared and connected to a DC power supply (E3631) 710 to supply heat to a heat pipe. A condenser was made of a copper block 740 with a high thermal conductivity. In the copper block, constant temperature water supplied from a bath circulator (RW-0525G) 750 flowed. The surface temperature of the heat pipe was measured by a plurality of thermocouples (K-type, Omega Engineering) 600 installed on a heat generator, a condenser, and a heat insulator and connected to a data collection device (DAQ, 34970A) 760. Two kinds of working fluids, FC-72 and ethanol, were prepared. Characteristics of FC-72 and ethanol are summarized in Table 1.

TABLE 1

| Working fluid | Boiling point of Working fluid * (° C.) | Surface tension * (mN/m) | Latent heat * (kJ/kg) | Density * (kg/m³) | Vapor density * (kg/m³) | Viscosity coefficient ** (Pas) | Specific heat * (kJ/KgK) |
|---|---|---|---|---|---|---|---|
| Ethanol | 78.4 | 22.27 | 846.19 | 734.79 | 1.75 | 430.43 | 3.202 |
| FC-72 | 56 | 9.48 | 84.73 | 1620.94 | 13.01 | 447.0 | 1.096 |

Figure 6:
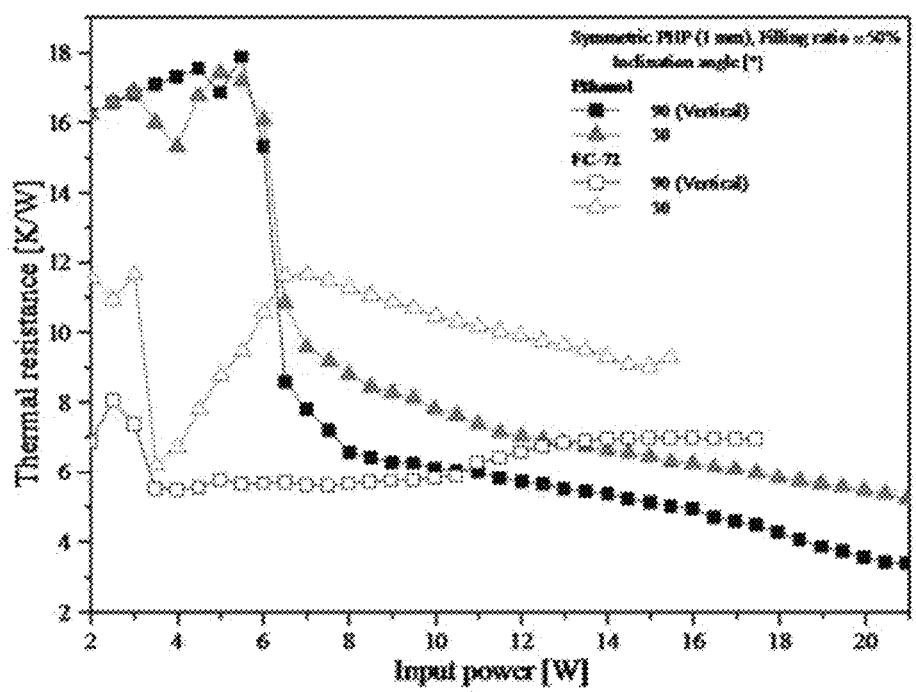
FIG. 6 is a diagram illustrating thermal resistance characteristics in accordance with operating temperatures and kinds of working fluids for a flat pulsating heat pipe having a multi-turn loop and a single diameter channel, according to the exemplary embodiment of the present invention.

With respect to the exemplary embodiment, FIG. 6 illustrates thermal resistance characteristics in accordance with operating temperatures and kinds of working fluids for a flat plate pulsating heat pipe with a multi-turn loop and a single diameter channel.

As illustrated in FIG. 6, when input power is low, FC-72 exhibits better heat transfer performance due to its lower heat resistance. On the other hand, when input power is high, ethanol exhibits better heat transfer performance. Typically, as a ratio of pressure to temperature dP/dT is increased, motion of a working fluid is more highly activated, resulting in improvement in performance of a pulsating heat pipe. FC-72 with a relatively low latent heat fully vaporizes and condenses more rapidly than ethanol. Therefore, FC-72 exhibits better performance at a lower temperature, but the performance converges to a predetermined level as the temperature rises. Meanwhile, as the temperature rises, the performance of ethanol slowly improves. When the temperature reaches or exceeds 100° C., ethanol exhibits better performance than FC-72.

Figure 7A:
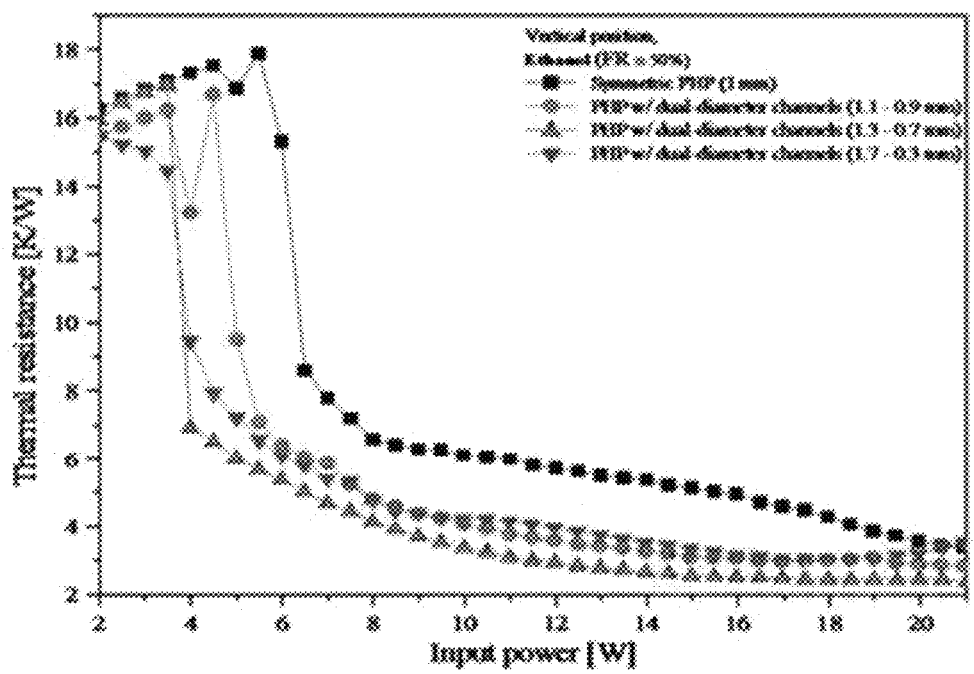
FIGS. 7A and 7B are diagrams illustrating thermal resistance characteristics in accordance with operating temperatures and kinds of working fluids for a flat plate pulsating heat pipe having a multi-turn loop and a dual diameter channel, according to the exemplary embodiment of the present invention.
Figure 7B:
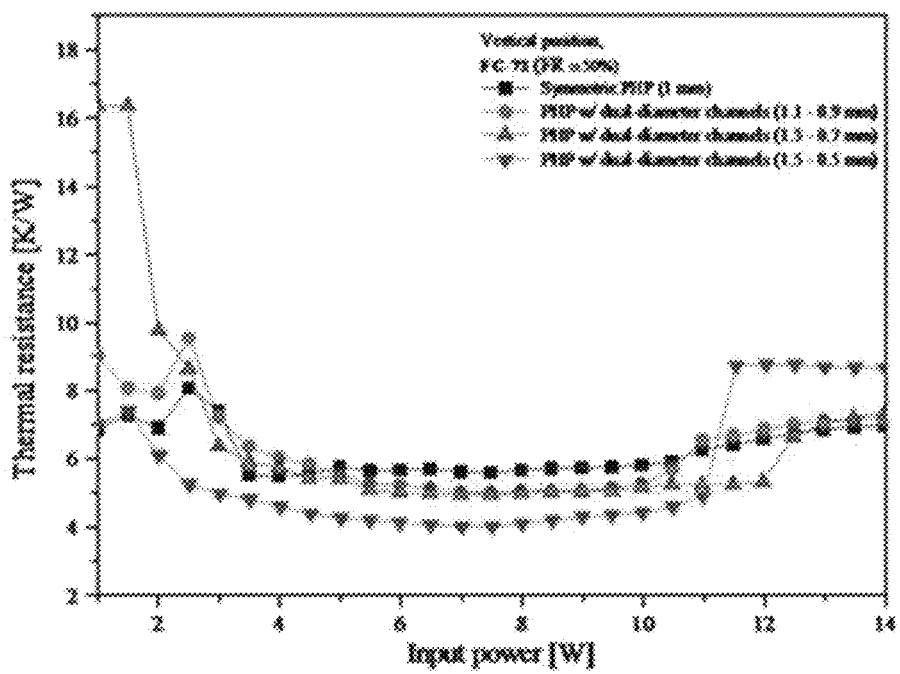

FIGS. 7A and 7B illustrate thermal resistance characteristics of a flat plate pulsating heat pipe in accordance with operating temperatures of a dual diameter channel of a multi-turn loop and kinds of working fluids, according to another embodiment of the present invention.

When the working fluid is ethanol, as illustrated in FIG. 7A, thermal resistance is low and heat transfer performance is high within a range of high temperatures.

On the other hand, when the working fluid is FC-72, as illustrated in FIG. 7B, the thermal resistance decreases as the temperature rises. However, when the temperature exceeds a predetermined temperature, the thermal resistance abruptly and dramatically increases. This change is more conspicuous when a diameter difference between two channel diameters is large.

Figure 8:
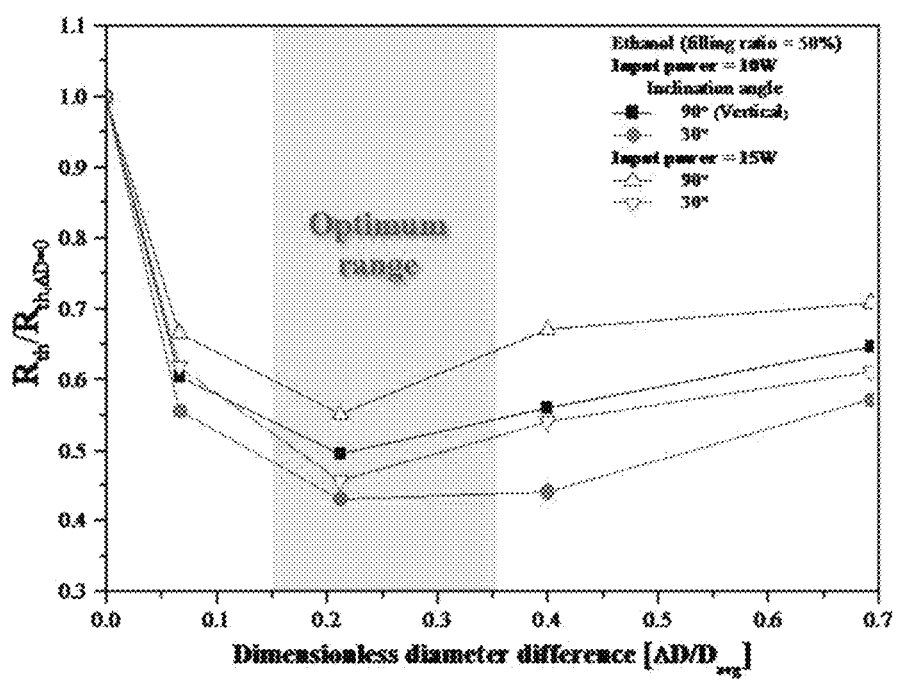
FIG. 8 is a diagram illustrating thermal resistance characteristics in accordance with diameter difference for a flat plate pulsating heat pipe having a multi-turn loop and a dual diameter channel, according to the exemplary embodiment of the present invention.

This means that there is an optimum diameter difference between two channel diameters. The diameter difference at which a flat plate pulsating heat pipe exhibits optimum performance, suggested by FIG. 8, satisfies the following condition:

Equation 2

$$0.15 \leq \Delta D/D_{avg} \leq 0.35 \quad \text{[Equation 2]}$$

where $\Delta D$ is difference between two diameters and $D_{avg}$ is average of two diameters.

A working fluid contained in a dual diameter channel of a multi-turn loop exhibits similar behaviors to a working fluid contained in a single diameter channel. That is, FC-72 exhibits better heat transfer performance when the input temperature is 100° C. or lower, but ethanol exhibits better performance when the input temperature is higher than 100° C.

The performance of a flat plate pulsating heat pipe having a multi-turn loop having a dual diameter channel is indirectly evaluated based on various indexes. Representation of the performance of a flat plate pulsating heat pipe varies according to an evaluator's perspective. Therefore, to conveniently and simply represent the performance of a flat plate pulsating heat pipe having a dual diameter channel structure, we use a figure of merit $M_{PHP}$ represented by a single numeric value and calculated according to Equation 3.

$$M_{PHP} = \frac{\text{Maximum driving pressure}}{\text{Frictional pressure drop}} = \frac{\rho_1 h_{fg} \sigma \left(\frac{1}{w_2} - \frac{1}{w_1}\right)}{\mu_1 \left[(1-x)^2 \left(1 + \frac{h}{w_1}\right)^4 \Phi_L^2 + \left(1 + \frac{h}{w_2}\right)^4\right]} \quad \text{Equation 3}$$

where $\rho_1$ is density of liquid phase of working fluid, $h_{fg}$ is latent heat of vaporization, $\sigma$ is surface tension, $w_1$ is width of a larger channel, $w_2$ is width of a smaller channel, $\mu_1$ is viscosity coefficient of a liquid phase of working fluid, x is vapor mass quality (mass of vapor with respect to mass of entire working fluid), h is height (depth) of a channel, $\Phi_L^2$ is a frictional multiplier (pressure difference required for two-phase flow/pressure difference required for liquid flow with same massflow rate.

In Equation 3, $\Phi_L^2$ is the frictional multiplier. It is a ratio of a pressure difference between pressures at respective ends of a heat pipe, required to activate motion of a working fluid when the heat pipe is filled with only liquid, with respect to a pressure difference between pressures at respective ends of the heat pipe, required to activate motion of a working fluid when the heat pipe is filled with liquid and gas. The frictional multiplier can be calculated using various models. A representative calculation model is Equation 4 using Martinelli parameter X. Normally, the frictional multiplier has a value within a range of from 0.001 to 10.

$$\Phi_L^2 = 1 + \frac{C}{X} + \frac{1}{X^2} \quad \text{Equation 4}$$

wherein C is Chisholm number.

Figure 9A:
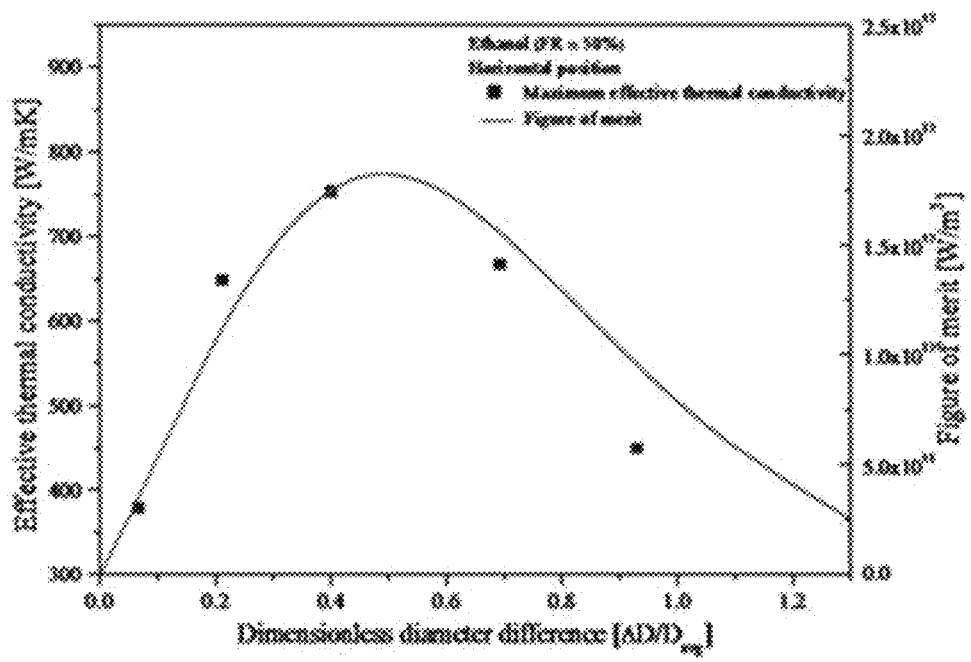
FIGS. 9A and 9B are diagrams illustrating heat transfer characteristics in accordance with figures of merit for a flat plate pulsating heat pipe having a multi-turn loop and a dual diameter channel, according to the exemplary embodiment of the present invention.
Figure 9B:
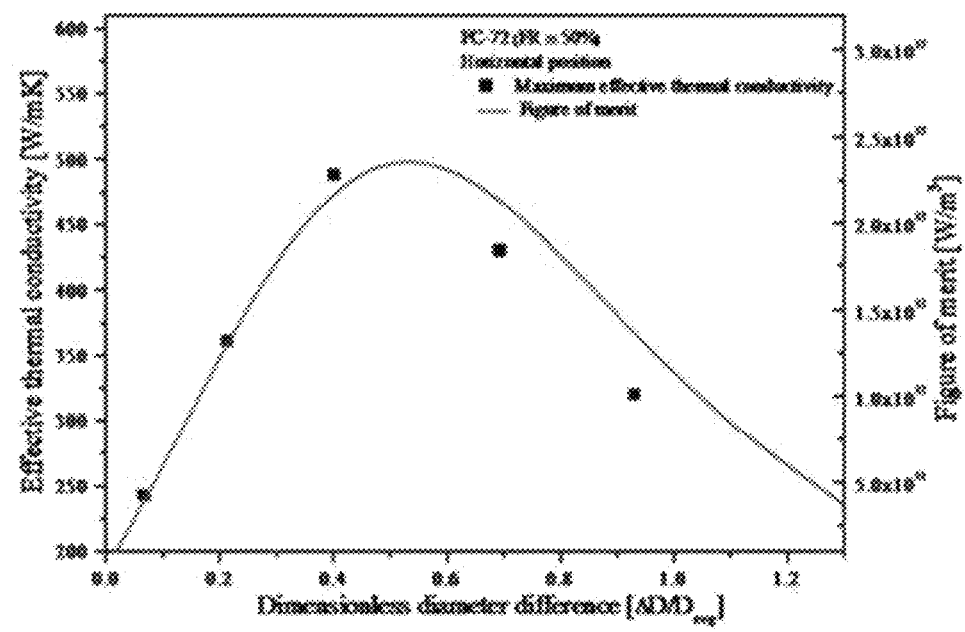

The evaluation result of the performance of a flat plate pulsating heat pipe on the basis of the performance index $M_{PHP}$ shows that a flat plate pulsating heat pipe exhibits good thermal conductivity when the performance index $M_{PHP}$ is $10^{12}$ kg/(m·s) (W/m³) or higher as shown in FIGS. 9A and 9B. Two diameters of a dual diameter channel can be calculated and other details of a flat plate pulsating heat pipe can be designed on the basis of the value of the performance index.

Figure 10:
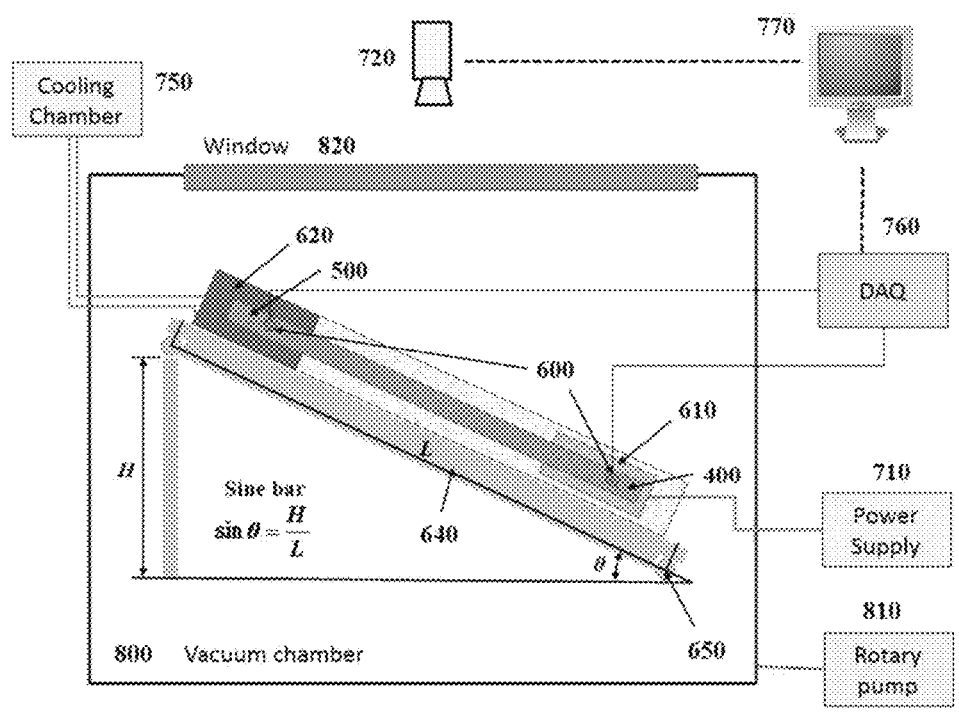
FIG. 10 is a diagram illustrating a test system prepared to evaluate operational characteristics of a flat plate pulsating heat pipe that is applicable at various angles, according to an exemplary embodiment of the present invention.

Meanwhile, a test system of FIG. 10 is designed and prepared to evaluate operational characteristics of a flat plate pulsating heat pipe that can be installed at various inclination angles.

To measure surface temperatures of a flat plate pulsating heat pipe that can be installed at various inclination angles, multiple thermocouples 600 are respectively installed in a heat generator, evaporator, condenser, and heat insulator. Examples of thermocouples that can be used in the present invention include K-type and Omega. Temperatures measured by the thermocouples 600 are transmitted to a control computer 700 via a data acquisition device (DAQ) 760.

A hot wire 610, manufactured by coating a wire with Nichrom, is connected to a direct current (DC) power supply (E3631) 710 so that heat can be supplied to a heat generation unit of a flat plate pulsating heat pipe. A copper block 620 with a high thermal conductivity is installed to surround the condenser to deprive the condenser of heat. Constant temperature water supplied by a bath circulator (RW-0525G) 750 flows through the copper block 620.

To evaluate thermal characteristics in accordance with various inclination angles for a flat plate pulsating heat pipe that can be installed at various inclination angles, a support table 640 to support a flat plate pulsating heat pipe is provided. A rotation unit 650 is installed to rotate the support table and thus change the inclination angle of the flat plate pulsating heat pipe.

Preferably, a flat plate pulsating heat pipe is installed in a vacuum chamber 800 for more accurate and precise evaluation of thermal characteristics. The vacuum chamber 800 is vacuumed by a rotary pump 810 so that a vacuum state can be created and maintained. The inside of the vacuum chamber 800 is maintained at or below 0.01 torr.

One surface of the vacuum chamber 800 is provided with a glass window 820 to allow visual checking of behaviors of a working fluid contained in a flat plate pulsating heat pipe. A high speed camera 720 installed outside the vacuum chamber 800 takes an image of the flat plate pulsating heat pipe through the window 820. The high speed camera 720 captures an image of the flat plate pulsating heat pipe, and information of the captured image is transmitted as video data to the control computer 770.

Figure 11A:
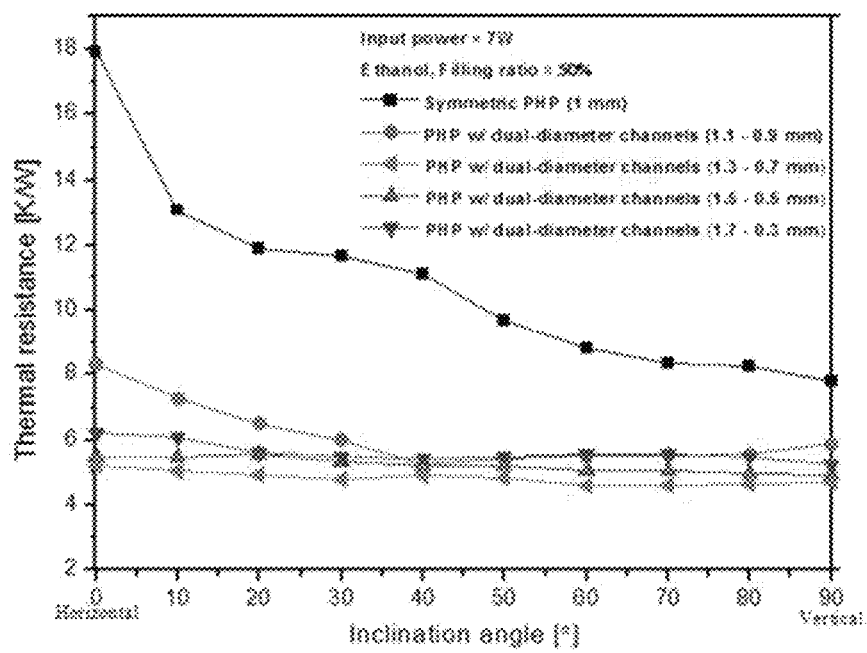
FIGS. 11A and 11B are diagrams illustrating thermal characteristics of a flat plate pulsating heat pipe in accordance with inclination angles of a single diameter channel and a dual diameter channel, according to the exemplary embodiment of the present invention.
Figure 11B:
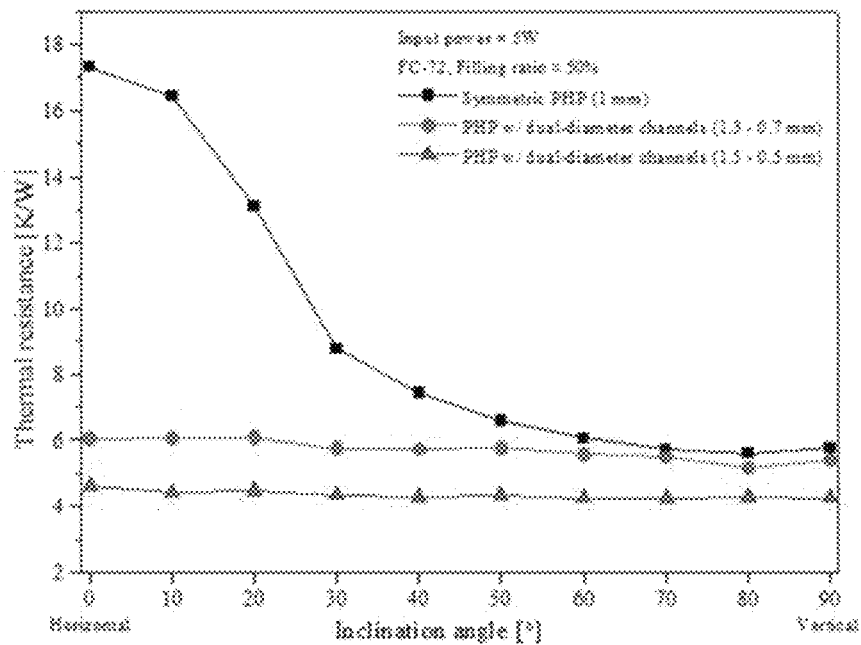

Flat plate pulsating heat pipes according to the present invention are tested using the above-described test system and the results are summarized in FIGS. 11A and 11B. FIG. 11A illustrates the performance of a flat plate pulsating heat pipe in which ethanol is used as a working fluid, and FIG. 11B illustrates the performance of a flat plate pulsating heat pipe in which FC-72 is used as a working fluid.

As illustrated in FIGS. 11A and 11B, a flat plate pulsating heat pipe having a dual diameter channel has much lower thermal resistance than a flat plate pulsating heat pipe having a single diameter channel, and thus the performance of the dual diameter channel is better.

Meanwhile, in the case of a single diameter channel, the thermal resistance is highest at an inclination angle of 0° and lowest at an inclination angle of 90° C. In the case of a dual diameter channel, as shown in FIG. 4A, when a diameter difference is small (i.e. within a range of 1.1 to 0.9 mm), the thermal resistance is highest at an inclination angle of 0° and lowest at an inclination angle of 90° C. as with the single diameter channel, but when the diameter difference is equal to or greater than 0.6 mm, the thermal resistance is not influenced by the inclination angle of the flat plate pulsating heat pipe.

However, as shown in FIG. 11A, the thermal resistance is lowest when the diameter difference is 0.6 mm. Therefore, it can be understood that the greater diameter difference not leads to the lower thermal resistance.

That is, there is an optimum diameter difference between two channel diameters. The optimum diameter difference at which a flat plate pulsating heat pipe exhibits optimum performance satisfies the following condition:

Equation 5

$$0.3 \leq \Delta D / D_{avg} \leq 0.35 \qquad \text{[Equation 5]}$$

wherein $\Delta D$ is a difference between two diameters and $D_{avg}$ is the average between two diameters.

Figure 12A:
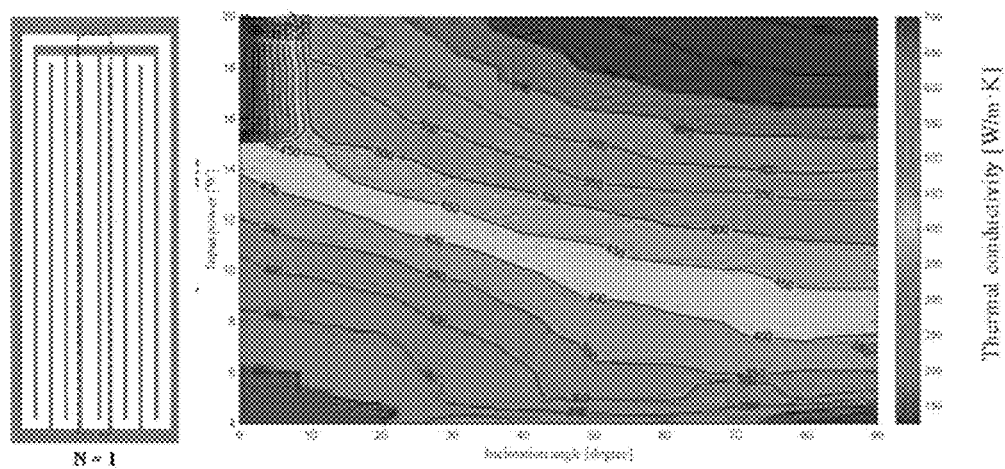
FIGS. 12A and 12B are diagrams illustrating thermal characteristics of a flat plate pulsating heat pipe that uses a single diameter channel and a dual diameter channel in combination, according to the exemplary embodiment of the present invention.
Figure 12B:
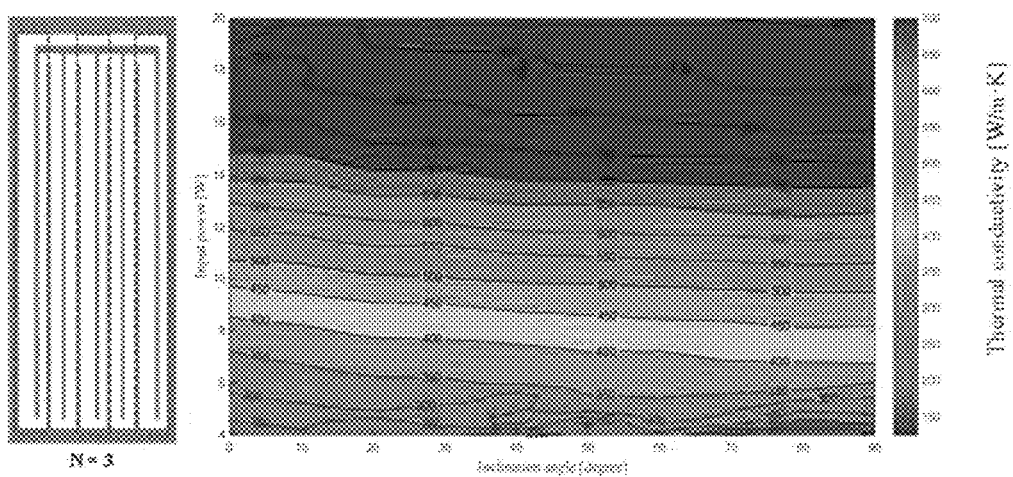

Meanwhile, as illustrated in FIGS. 12A and 12B, behaviors of a flat plate pulsating heat pipe with a single diameter channel and a flat plate pulsating heat pipe with a dual diameter channel are observed. FIG. 12A illustrates the behavior of a flat plate pulsating heat pipe with five capillary tubes one of which is formed of a dual diameter channel, and FIG. 12B illustrates the behavior of a flat plate pulsating heat pipe with five capillary tubes three of which are formed of a dual diameter channel.

As illustrated in FIG. 12A, in a case where there is only one dual diameter channel in a flat plate pulsating heat pipe, the thermal conductivity tends to increase in accordance with an inclination angle. When the inclination angle is within a range of from 0° to 10°, the thermal characteristics are not good. On the other hand, when there are three dual diameter channels in a flat plate pulsating heat pipe, the thermal conductivity is high over the entire inclination angle range.

Accordingly, in a case where a single diameter channel and a dual diameter channel are used in combination in a flat plate pulsating heat pipe, the thermal characteristics of the flat plate pulsating heat pipe largely vary in accordance with a proportion of the dual diameter channels with respect to all of the channels. To accurately and precisely evaluate the performance of a flat plate pulsating heat pipe, a performance index $M_{PHP2}$, i.e. figure of merit, calculated according to Equation 6 is used.

$$M_{PHP2} = \frac{\text{Maximim capillary driving pressure}}{\text{Frictional pressure drop}} = \frac{N \rho_1 \sigma \left( \frac{1}{w_2} - \frac{1}{w_1} \right)}{\mu_1 C \left[ N \left\{ \left(1 + \frac{h}{w_1}\right)^4 + \left(1 + \frac{h}{w_2}\right)^4 \right\} + (N_t - N)\left(1 + \frac{h}{w}\right)^4 \right]} \qquad \text{Equation 6}$$

where N is the number of dual diameter channels, $N_t$ is the total number of all of the channels, $\rho_1$ is density of liquid phase of working fluid, $\sigma$ is surface tension, $w_1$ is width of a larger channel of a dual diameter channel, $w_2$ is width of a smaller channel of a dual diameter channel, $h_{fg}$ is latent heat of vaporization, $w_1$ is width of a larger channel, $w_2$ is width of a smaller channel, w is width of channel of a single diameter channel, $\mu_1$ is viscosity coefficient of a liquid phase of working fluid, C is a frictional coefficient, and h is height (depth) of a channel, wherein all units herein are SI base units.

The frictional coefficient C can be calculated in various ways. However, a fixed value of 4.0 is preferably used for easy calculation.

Figure 13A:
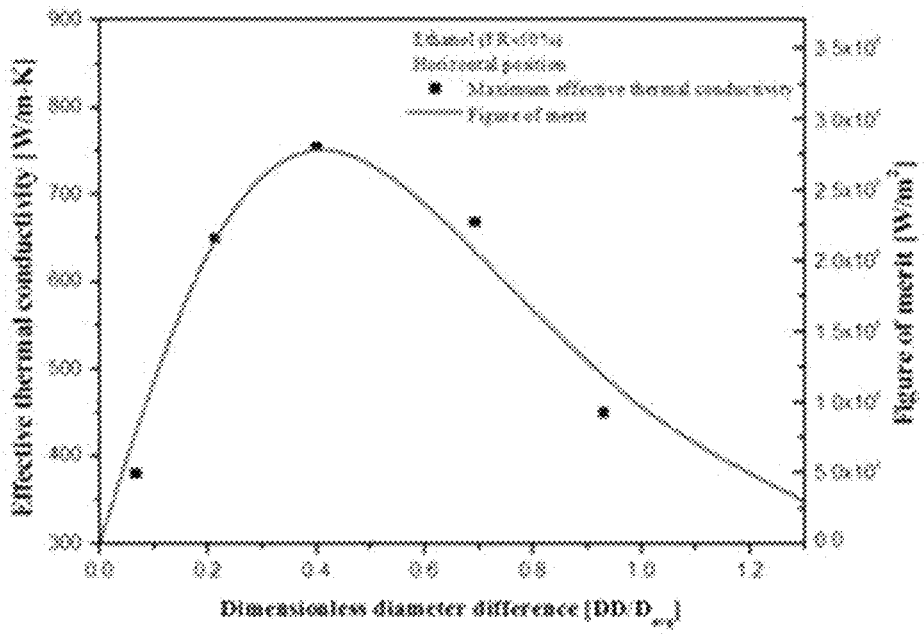
FIGS. 13A to 13C are diagrams illustrating figures of merit of a flat plate pulsating heat pipe that can be installed at various inclination angles, according to the exemplary embodiment of the present invention.
Figure 13B:
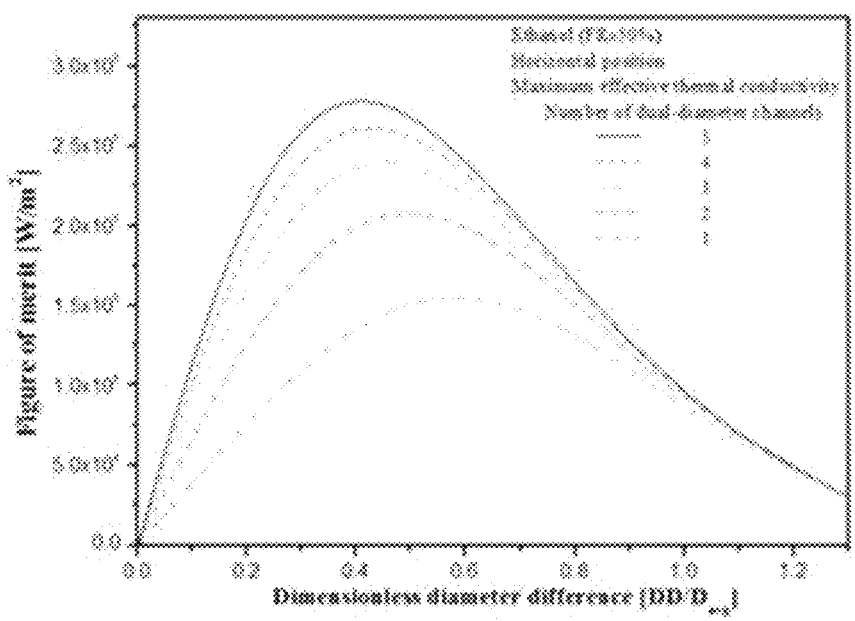
Figure 13C:
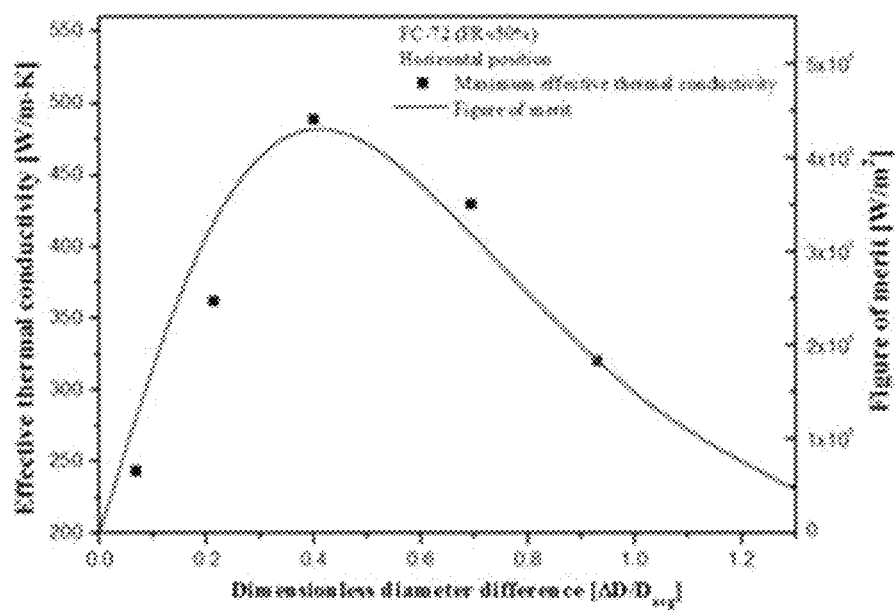

As illustrated in FIGS. 13A to 13C, thermal characteristics of a flat plate pulsating heat pipe largely vary according to a diameter difference between two channel diameters of a dual diameter channel, a ratio of the number of single diameter channels, and the number of dual diameter channels, and the kind of a working fluid.

As illustrated in FIG. 13A, a dimensionless diameter difference $\Delta D/D_{avg}$ of a dual diameter channel, at which optimum thermal performance can be obtained, is within a range of from 0.3 to 0.5. Within the range, the thermal conductivity of a flat plate pulsating heat pipe is about 90% of the maximum thermal conductivity thereof or higher. FIG. 13C shows that similar results can be obtained even when FC-72 is used as the working fluid instead of ethanol.

The test result also shows that the thermal characteristics of a flat plate pulsating heat pipe are not influenced by inclination angles when the performance index of the dual diameter channel is $2 \times 10^5$ kg/(m$^3$·s) or higher. This means that a flat plate pulsating heat pipe has to be designed such that its performance index is $2 \times 10^5$ kg/(m$^3$·s) or higher.

In addition, as illustrated in FIG. 13B, as the proportion of the dual diameter channel is increased, the thermal performance of the flat plate pulsating heat pipe is improved. As described above, to obtain a flat plate pulsating heat pipe with a performance index of $2 \times 10^5$ kg/(m$^3$·s) or higher, the number of dual diameter channels in the flat plate pulsating heat pipe has to be equal to or greater than three (i.e. the proportion of the dual diameter channel has to be 60% or higher) and the dimensionless diameter difference $\Delta D/D_{avg}$ of the dual diameter channel has to be within a range of from 0.3 to 0.5.

As described above, a flat plate pulsating heat pipe is designed on the basis of the performance index $M_{PHP}$. Since the characteristics of the designed flat plate pulsating heat pipe are greatly influenced by operating temperatures and kinds of working fluids, those skilled in the art will appreciate that various modifications, additions and substitutions are possible, without departing from the technical spirit of the invention. Accordingly, the technical scope of the present invention should not be limited to the above descriptions but should be defined by the appended claims.

INDUSTRIAL APPLICABILITY

A flat plate pulsating heat pipe according to the present invention can be used in various industry fields, for example, in various electronic devices, small internal combustion engines, and small machinery. Since the flat plate pulsating heat pipe is power free and thus can be quasi-permanently used, the flat plate pulsating heat pipe is highly useful in industrial fields.

The invention claimed is:

1. A flat plate pulsating heat pipe comprising:
   a silicon lower wafer plate having a rectangular shape;
   a capillary tube formed in an upper portion of the silicon lower wafer plate and shaped to bend at positions near respective ends of the silicon lower wafer plate to form a closed loop;
   an upper wafer plate bonded onto the silicon lower wafer plate to seal the capillary tube;
   a working fluid in the capillary tube;
   an evaporator provided to an end portion of the capillary tube in a longitudinal direction of the silicon lower wafer plate and located near an external heat source installed outside the silicon lower wafer plate; and
   a condenser that is provided to an opposite end portion of the capillary tube in the longitudinal direction of the silicon lower wafer plate and at which the working fluid heated by the external heat source radiates heat outside the capillary tube, wherein the capillary tube has a larger diameter in a portion from the evaporator to the condenser and a smaller diameter in a portion from the condenser to the evaporator, and
   performance of the flat plate pulsating heat pipe is represented by the following figure of merit ($M_{PHP}$):

$$M_{PHP} = \frac{\text{Maximum driving pressure}}{\text{Frictional pressure drop}} = \frac{\rho_l h_{fg} \sigma \left(\frac{1}{w_2} - \frac{1}{w_1}\right)}{\mu_l \left[(1-x)^2 \left(1 + \frac{h}{w_1}\right)^4 \Phi_L^2 + \left(1 + \frac{h}{w_2}\right)^4\right]}$$

where $\rho_l$ is density of liquid phase of working fluid, $h_{fg}$ is latent heat of vaporization, $\sigma$ is surface tension, $w_1$ is width of larger channel, $w_2$ is width of smaller channel, $\mu_l$ is viscosity coefficient of liquid phase of working fluid, x is vapor mass quality (mass of vapor with respect to mass of entire working fluid), h is height (depth) of channel, $\Phi_L^2$ is frictional multiplier (pressure difference required for two-phase flow/pressure difference required for liquid flow with same massflow rate).

2. The flat plate pulsating heat pipe according to claim 1, wherein the capillary tube has a single-turn loop shape.

3. The flat plate pulsating heat pipe according to claim 1, wherein the capillary tube has a multi-turn loop shape.

4. The flat plate pulsating heat pipe according to claim 1, wherein FC-72 is used as the working fluid when a main operating temperature of the evaporator is 100° C. or lower but ethanol is used as the working fluid when the main operating temperature of the evaporator is higher than 100° C.

5. The flat plate pulsating heat pipe according to claim 1, wherein the figure of merit ($M_{PHP}$) of the flat plate pulsating heat pipe is $10^{12}$ kg/(m·s)(W/m$^3$) or higher.

6. The flat plate pulsating heat pipe according to claim 1, wherein a thickness of the flat plate pulsating heat pipe is 2 mm or less.

7. The flat plate pulsating heat pipe according to claim 1, further comprising two through-holes provided to respective side surfaces of the silicon lower wafer plate, the two through-holes communicating with the capillary tube and used such that the working fluid is charged into and discharged from the capillary tube through the two through-holes.

8. A flat plate pulsating heat pipe comprising:
   a silicon lower wafer plate having a rectangular shape;
   a capillary tube including a channel formed to have a predetermined depth in an upper portion of the silicon lower wafer plate, the channel linearly extending in a longitudinal direction of the silicon lower wafer plate and bending at positions near respective ends of the silicon lower wafer plate, thereby forming a closed loop;
   an upper wafer plate bonded to the silicon lower wafer plate to seal the capillary tube; and
   a working fluid in the capillary tube,
   wherein the capillary tube is a combination of a dual diameter channel including a pair of channels with respectively different widths and a single diameter channel including a pair of channels with a same width.

9. The flat plate pulsating heat pipe according to claim 8, wherein a diameter of the capillary tube is represented by the following equation:

$$D_h = \frac{4A_c}{\text{Perimeter}} = \frac{2wh_{ch}}{w + h_{ch}}$$

where $A_C$ is area, perimeter is length of circumference, w is width of capillary tube, and $h_{ch}$ is height of capillary tube.

10. The flat plate pulsating heat pipe according to claim 9, wherein two diameters of the dual diameter channel satisfy the following condition:

$$0.3 \leq \Delta D/D_{avg} \leq 0.5$$

where $\Delta D$ is difference between two diameters and $D_{avg}$ is average of two diameters.

11. The flat plate pulsating heat pipe according to claim 8, wherein the capillary tube includes a plurality of dual diameter channels, and
wherein a proportion of a number of dual diameter channels with respect to a total number of channels in the entire capillary tube is 60% or higher.

12. The flat plate pulsating heat pipe according to claim 8, wherein a performance of the flat plate pulsating heat pipe is represented by the following figure of merit ($M_{PHP2}$):

$$M_{PHP2} = \frac{\text{Maximim capillary driving pressure}}{\text{Frictional pressure drop}} = $$

$$\frac{N\rho_1\sigma\left(\frac{1}{w_2} - \frac{1}{w_1}\right)}{\mu_1 C\left[N\left\{\left(1 + \frac{h}{w_1}\right)^4 + \left(1 + \frac{h}{w_2}\right)^4\right\} + (N_t - N)\left(1 + \frac{h}{w}\right)^4\right]}$$

where N is number of dual diameter channels, $N_t$ is number of all channels, $\rho_1$ is density of liquid phase of working fluid, $\sigma$ is surface tension, $w_1$ is width of a larger channel of dual diameter channel, $w_2$ is width of a smaller channel of dual diameter channel, $w_1$ is width of a larger channel, $w_2$ is width of smaller channel, w is width of a channel of single diameter channel, $\mu_1$ is viscosity coefficient of a liquid phase of working fluid, C is a frictional coefficient, and h is height (depth) of a channel, wherein all units herein are SI base units.

13. The flat plate pulsating heat pipe according to claim 12, wherein the figure of merit ($M_{PHP2}$) is a value of $2\times10^5$ kg/(m$^3$·s) or greater.

14. A method of manufacturing a flat plate pulsating heat pipe using a Micro Electro Mechanical System (MEMS) manufacturing process, the method comprising:
(a) depositing a photoresist layer on an upper surface of a silicon wafer having a rectangular shape;
(b) patterning the photoresist layer into to a pattern corresponding a shape of a capillary tube, the capillary tube being bent at positions near respective ends of the silicon wafer, thereby having a closed loop shape;
(c) forming the capillary tube by etching the silicon wafer;
(d) removing the photoresist layer remaining on the etched silicon wafer; and
(e) bonding an upper wafer plate onto an upper surface of the etched silicon wafer,
wherein in the step (b), the patterning is performed such that two through-holes extending to respective side surfaces of the silicon wafer and communicating with the capillary tube are formed.

15. The method according to claim 14, wherein in the step (b), the capillary tube has a multi-turn loop shape.

16. The method according to claim 14, wherein in the step (b), the capillary tube is a combination of a dual diameter channel including a pair of channels with respectively different widths and a single diameter channel including a pair of channels with a same width.

17. The method according to claim 16, wherein the capillary tube includes a plurality of dual diameter channels, and
wherein a proportion of a number of dual diameter channels with respect a total number of channels in the entire capillary tube is 60% or higher.

18. The method according to claim 15, wherein performance of the flat plate pulsating heat pipe is represented by the following figure of merit ($M_{PHP}$):

$$M_{PHP} = \frac{\text{Maximim driving pressure}}{\text{Frictional pressure drop}} = \frac{\rho_1 h_{fg}\sigma\left(\frac{1}{w_2} - \frac{1}{w_1}\right)}{\mu_1\left[(1-x)^2\left(1 + \frac{h}{w_1}\right)^4 \Phi_L^2 + \left(1 + \frac{h}{w_2}\right)^4\right]}$$

where $\rho_1$ is density of liquid phase of working fluid, $h_{fg}$ is latent heat of vaporization, $\sigma$ is surface tension, $w_1$ is width of a larger channel, $w_2$ is width of a smaller channel, $\mu_1$ is viscosity coefficient of a liquid phase of working fluid, x is vapor mass quality (mass of vapor with respect to mass of entire working fluid, h is height (depth) of a channel, $\Phi^2_L$ is a frictional multiplier (pressure difference required for two-phase flow/pressure difference required for mass flow rate of liquid flow of same phase).

19. The method according to claim 16, wherein performance of the flat plate pulsating heat pipe is represented by the following figure of merit ($M_{PHP2}$):

$$M_{PHP2} = \frac{\text{Maximim capillary driving pressure}}{\text{Frictional pressure drop}} = $$

$$\frac{N\rho_1\sigma\left(\frac{1}{w_2} - \frac{1}{w_1}\right)}{\mu_1 C\left[N\left\{\left(1 + \frac{h}{w_1}\right)^4 + \left(1 + \frac{h}{w_2}\right)^4\right\} + (N_t - N)\left(1 + \frac{h}{w}\right)^4\right]}$$

where N is number of dual diameter channels, $N_t$ is number of all channels, $\rho_1$ is density of liquid phase of working fluid, $\sigma$ is surface tension, $w_1$ is width of a larger channel of a dual diameter channel, $w_2$ is width of a smaller channel of a dual diameter channel, $w_1$ is with of a larger channel, $w_2$ is width of a smaller channel, w is width of each channel of a single diameter channel, $\mu_1$ is viscosity coefficient of a liquid phase of working fluid, C is frictional coefficient, and h is height (depth) of a channel, wherein all units herein are SI base units.

* * * * *